United States Patent
Kumar Vaidyula et al.

(10) Patent No.: US 11,315,637 B2
(45) Date of Patent: Apr. 26, 2022

(54) ADAPTIVE ERASE VOLTAGE BASED ON TEMPERATURE

(71) Applicant: WESTERN DIGITAL TECHNOLOGIES, INC., San Jose, CA (US)

(72) Inventors: Kranthi Kumar Vaidyula, Karnataka (IN); Amiya Banerjee, Karnataka (IN); Phani Raghavendra Yasasvi Gangavarapu, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/891,702

(22) Filed: Jun. 3, 2020

(65) Prior Publication Data
US 2021/0383873 A1 Dec. 9, 2021

(51) Int. Cl.
*G11C 16/16* (2006.01)
*G11C 16/30* (2006.01)
(Continued)

(52) U.S. Cl.
CPC .......... *G11C 16/16* (2013.01); *G11C 16/0483* (2013.01); *G11C 16/12* (2013.01);
(Continued)

(58) Field of Classification Search
CPC ..... G11C 16/16; G11C 16/3472; G11C 16/14; G11C 16/3436; G11C 16/3445;
(Continued)

(56) References Cited

U.S. PATENT DOCUMENTS

| 10,923,196 B1* | 2/2021 | Rabkin | G11C 16/16 |
| 2010/0110815 A1* | 5/2010 | Lee | G11C 7/04 |
| | | | 365/211 |

(Continued)

FOREIGN PATENT DOCUMENTS

CN 108109659 A 6/2018

OTHER PUBLICATIONS

International Search Report issued in PCT/US2021/019733, dated Jun. 13, 2021.
Written Opinion of International Search Authority issued in PCT/US2021/019733, dated Jun. 13, 2021.

*Primary Examiner* — Mushfique Siddique
(74) *Attorney, Agent, or Firm* — Arentfox Schiff LLP

(57) ABSTRACT

Aspects of a storage device including a memory and controller are provided which allow for erase voltages applied during erase operations to be adaptively changed at elevated temperatures to reduce erase time and prevent erase failures. In response to detecting a lower temperature of the memory, the controller applies a first erase voltage to cells in a block of a die, and in response to detecting a higher temperature of the memory, the controller applies a second erase voltage larger than the first erase voltage to the cells in the block of the die. The controller may apply the different erase voltages depending on whether the temperature of the die falls within respective temperature ranges or meets a respective temperature threshold, which may change for different dies. As a result, successful erase operations at higher temperatures may be achieved.

14 Claims, 12 Drawing Sheets

(51) Int. Cl.
    *G11C 16/12*     (2006.01)
    *G11C 16/34*     (2006.01)
    *G11C 16/04*     (2006.01)
    *G11C 16/14*     (2006.01)

(52) U.S. Cl.
    CPC .............. *G11C 16/14* (2013.01); *G11C 16/30* (2013.01); *G11C 16/349* (2013.01); *G11C 16/3436* (2013.01); *G11C 16/3445* (2013.01); *G11C 16/3472* (2013.01); *G11C 2216/18* (2013.01)

(58) Field of Classification Search
    CPC ..... G11C 16/0483; G11C 16/30; G11C 16/12; G11C 16/349; G11C 2216/18
    See application file for complete search history.

(56) References Cited

U.S. PATENT DOCUMENTS

| | | |
|---|---|---|
| 2012/0033503 A1 | 2/2012 | Kim et al. |
| 2014/0204694 A1 | 7/2014 | Choy |
| 2014/0269111 A1 | 9/2014 | He et al. |
| 2014/0321211 A1* | 10/2014 | Mu .................... G11C 16/3445 365/185.19 |
| 2016/0093387 A1* | 3/2016 | Oh ...................... G11C 11/5635 365/185.11 |
| 2016/0133330 A1* | 5/2016 | Choe .................... G11C 16/14 365/185.29 |
| 2017/0069369 A1 | 3/2017 | Kim et al. |
| 2018/0293009 A1* | 10/2018 | Sharon ............... G11C 16/3431 |
| 2019/0287618 A1 | 9/2019 | Kimura et al. |

* cited by examiner

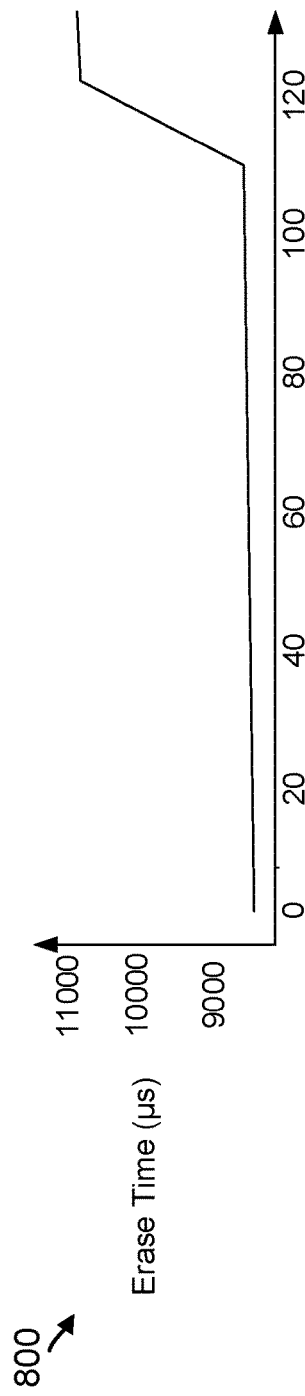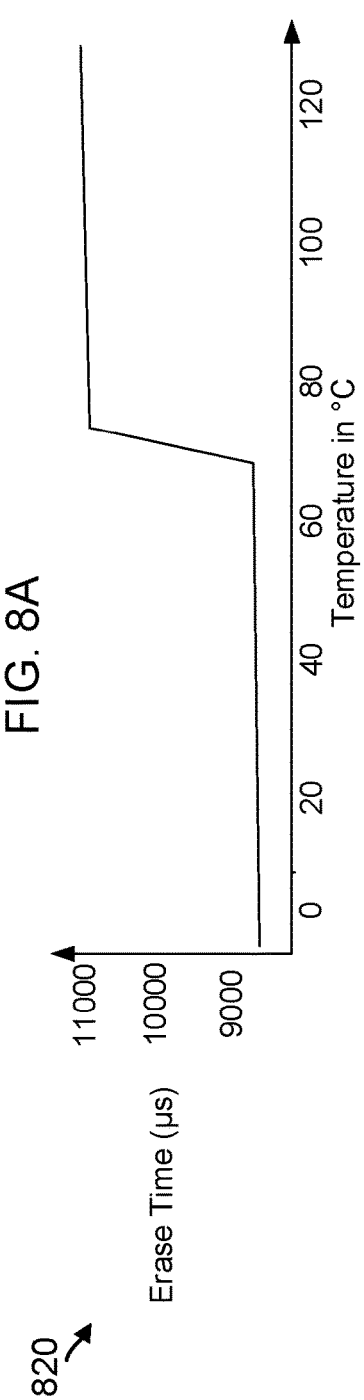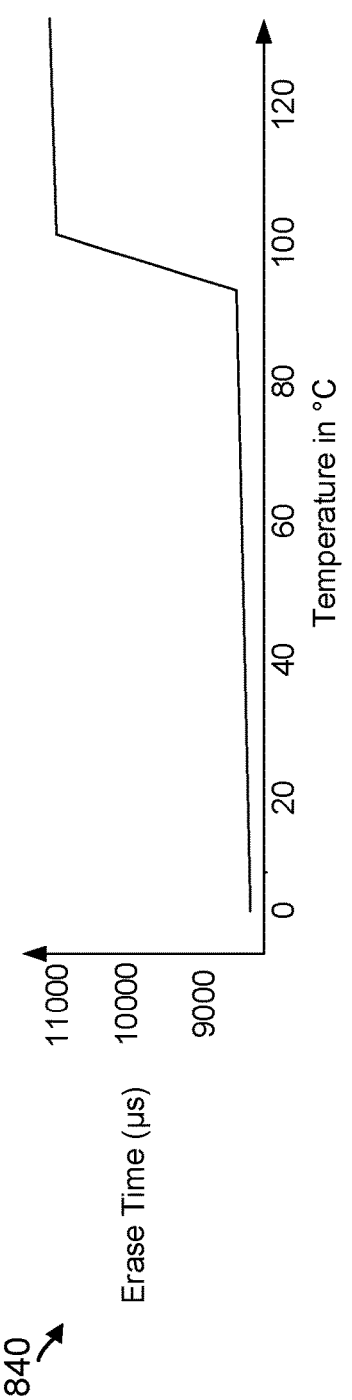

ADAPTIVE ERASE VOLTAGE BASED ON TEMPERATURE

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When erasing data from a block of the flash memory, the flash storage device may identify the physical address of the block associated with the logical address in which the data is stored, and may then erase the data from the block at the identified physical address. Such block erases may successfully occur at certain device operating temperatures (e.g. room temperature). However, the goal of these devices to realize low-cost storage has led to development of high-density NAND flash memory, which may impact the thermal reliability of the device. For example, removable product group (RPG) products such as Secure Digital (SD) and micro-SD cards may include numerous die stacks (to save cost) and high speed input/output (I/O) data transactions between the NAND and a controller of the storage device, thereby resulting in elevated device operating temperatures (e.g. 125° C.). As a result of these high temperatures, the block erases may fail and result in the identification of such failed blocks as grown bad blocks (GBBs), impacting the performance and efficiency of the flash storage device.

SUMMARY

One aspect of a storage device is disclosed herein. The storage device includes a memory and a controller. The memory comprises a cell. The controller is configured to apply a first erase voltage to a substrate of the cell in response to a first temperature of the memory, and to apply a second erase voltage larger than the first erase voltage to the substrate of the cell in response to a second temperature of the memory, where the second temperature is higher than the first temperature.

Another aspect of a storage device is disclosed herein. The storage device includes a memory and a controller. The memory comprises a die including a plurality of cells. The controller is configured to apply a first erase voltage to each of the cells in response to the die being within a first temperature range, and to apply a second erase voltage larger than the first erase voltage to each of the cells when the die is within a second temperature range including higher temperatures than the first temperature range.

A further aspect of a storage device is disclosed herein. The storage device includes a memory and a controller. The memory comprises a first die including a first cell and a second die including a second cell. The controller is configured to apply a first erase voltage to the first cell when a temperature of the first die does not meet a first temperature threshold and to apply a second erase voltage to the first cell when the temperature of the first die meets the first temperature threshold. The controller is further configured to apply the first erase voltage to the second cell when a temperature of the second die does not meet a second temperature threshold and to apply the second erase voltage to the second cell when the temperature of the second die meets the second temperature threshold, where the second temperature threshold is different than the first temperature threshold.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIGS. 8A-8C are graphical diagrams illustrating examples of different relationships between erase time and temperature for different dies.

DETAILED DESCRIPTION

Figure 1:
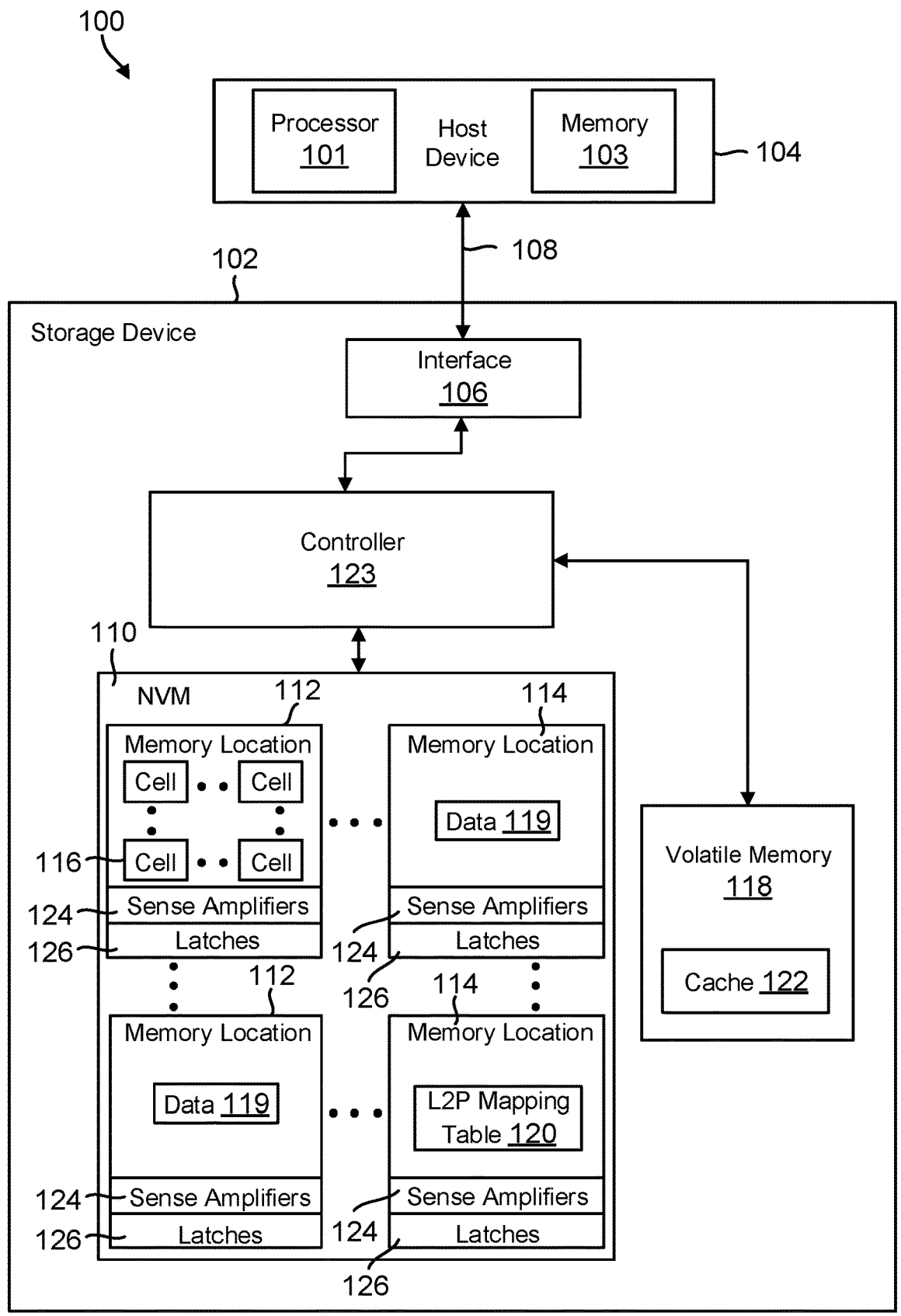
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

High temperatures in flash memory may significantly affect data retention. For example, more flip bit counts (FBC) may occur at higher temperatures of NAND than at lower temperatures of NAND, since elevated temperatures may result in a higher rate of charge loss in the cells (e.g. at the floating gate or charge trapping layer). To address the possible increase in FBC at elevated temperatures, a controller of the storage device may adjust internal read voltage threshold levels according to temperature. For example, when reading data or performing a verify operation to determine whether a cell is successfully programmed, the read voltage thresholds that are compared against the threshold voltage of the cell may be reduced to account for charge loss at higher temperatures. Such adjustments may be an exponential function of temperature (e.g. small increases in temperature may result in increasingly large threshold adjustments), significantly impacting testing and usage of NAND.

However, temperature may affect the success of erase operations as well as data retention (e.g. programs and reads). For instance, the time to erase a NAND block at elevated temperature may be significantly longer than the time to erase the block at room temperature. In such case, the erase time may exceed an expected time (e.g. a threshold number of erase loops), and as a result, an erase status failure may occur. When the erase operation of the block fails in such instance, the block may be identified as a GBB, and an overprovisioned block may be allocated to replace the GBB. As elevated temperatures may similarly cause erase failures of multiple blocks, many blocks may be identified as GBBs and an equal number of blocks may be supplied from overprovisioning, thereby increasing the write amplification factor (WAF) of the storage device and degrading the endurance, performance, and quality of service (QoS) of the device.

To address this problem of longer erase times at elevated temperatures, the storage device described in the present disclosure may increase the erase voltage applied to the blocks of a die at higher temperatures and may apply a default or smaller erase voltage at lower temperatures. For example, the storage device may apply a default erase voltage of 16.8 V when the temperature of the die is less than 75° C. and an adjusted erase voltage of 17.5 V when the temperature of the die is above 75° C. The adjusted erase voltage may be marginally higher than the default erase voltage in order to minimize NAND stress. Moreover, the storage device may apply the adjusted erase voltage at different temperatures depending on the die (e.g. above 75° C. in one die and above 100° C. in another die). By adaptively adjusting the erase voltage to higher voltages at elevated temperatures and to lower voltages at other temperatures depending on the die, the erase time may remain constant at the different die temperatures and thus avoid exceeding the threshold number of erase loops, thereby preventing erase failures and improving the WAF, endurance, performance, and QoS of the storage device.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, Hiper-LAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks. The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
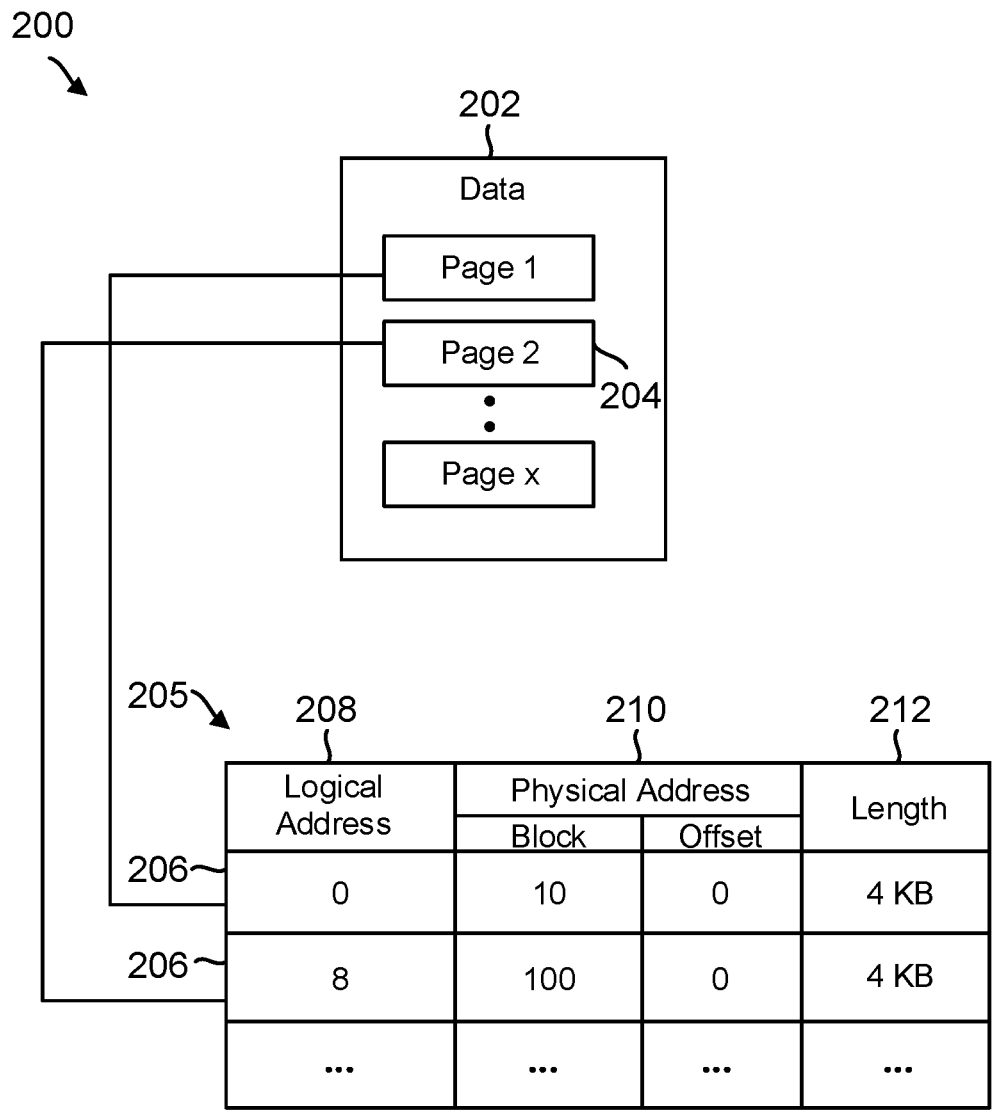
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
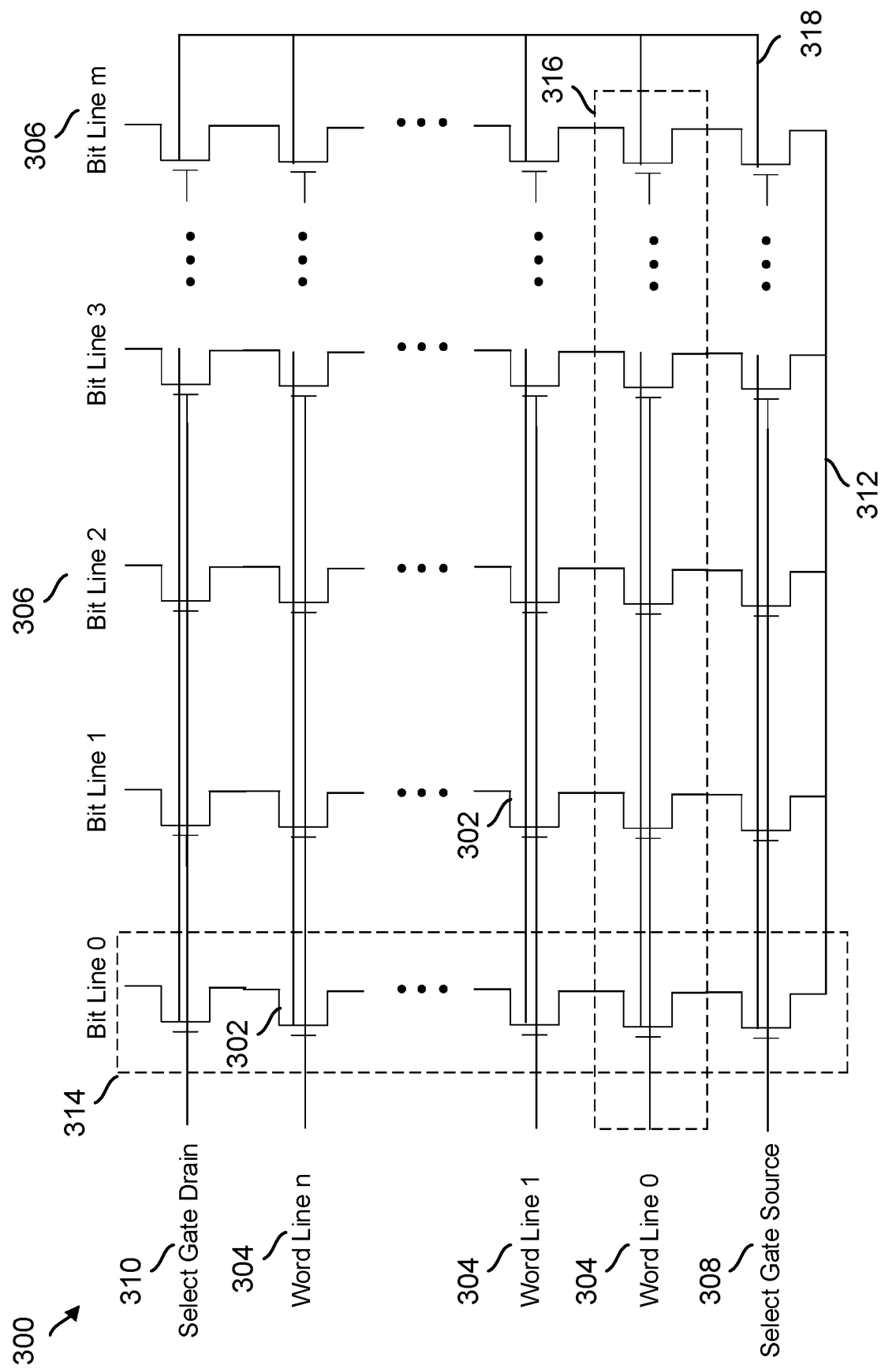
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block 114 of the NVM 110, where n and m are predefined according to the size of the block. Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block. The cells 302 within the block may also commonly share a substrate 318.

Figure 4:
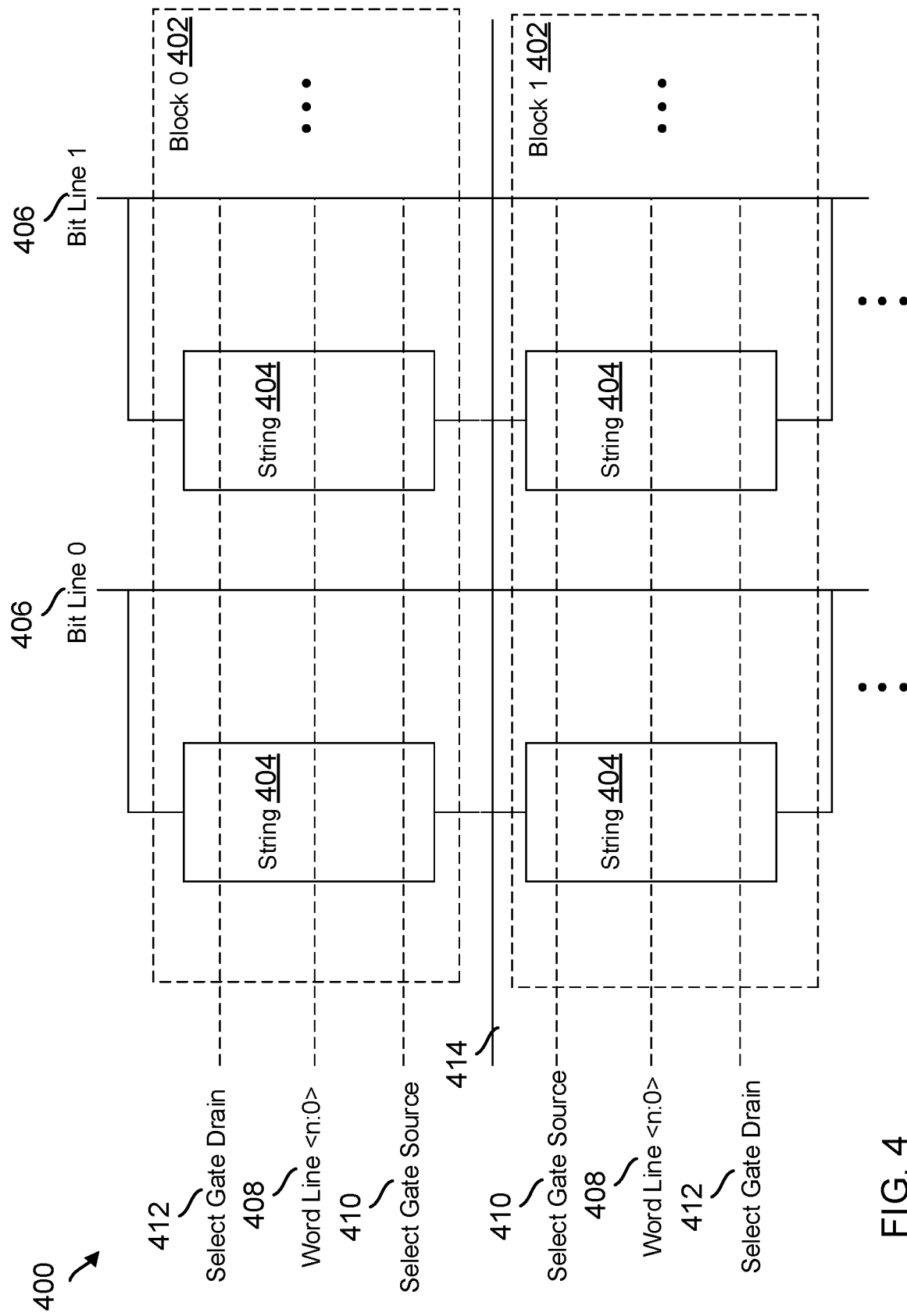
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by applying the program voltage to the cell 302 on the word line 304, 408 until the cell reaches the threshold voltage, and during an erase operation, the controller may apply an erase voltage to the block 402 including the cells 302 (e.g. to the substrate 318 of the cells such as a p-well) until the cells reduce back below the threshold voltage (back to logic '1').

Figure 5:
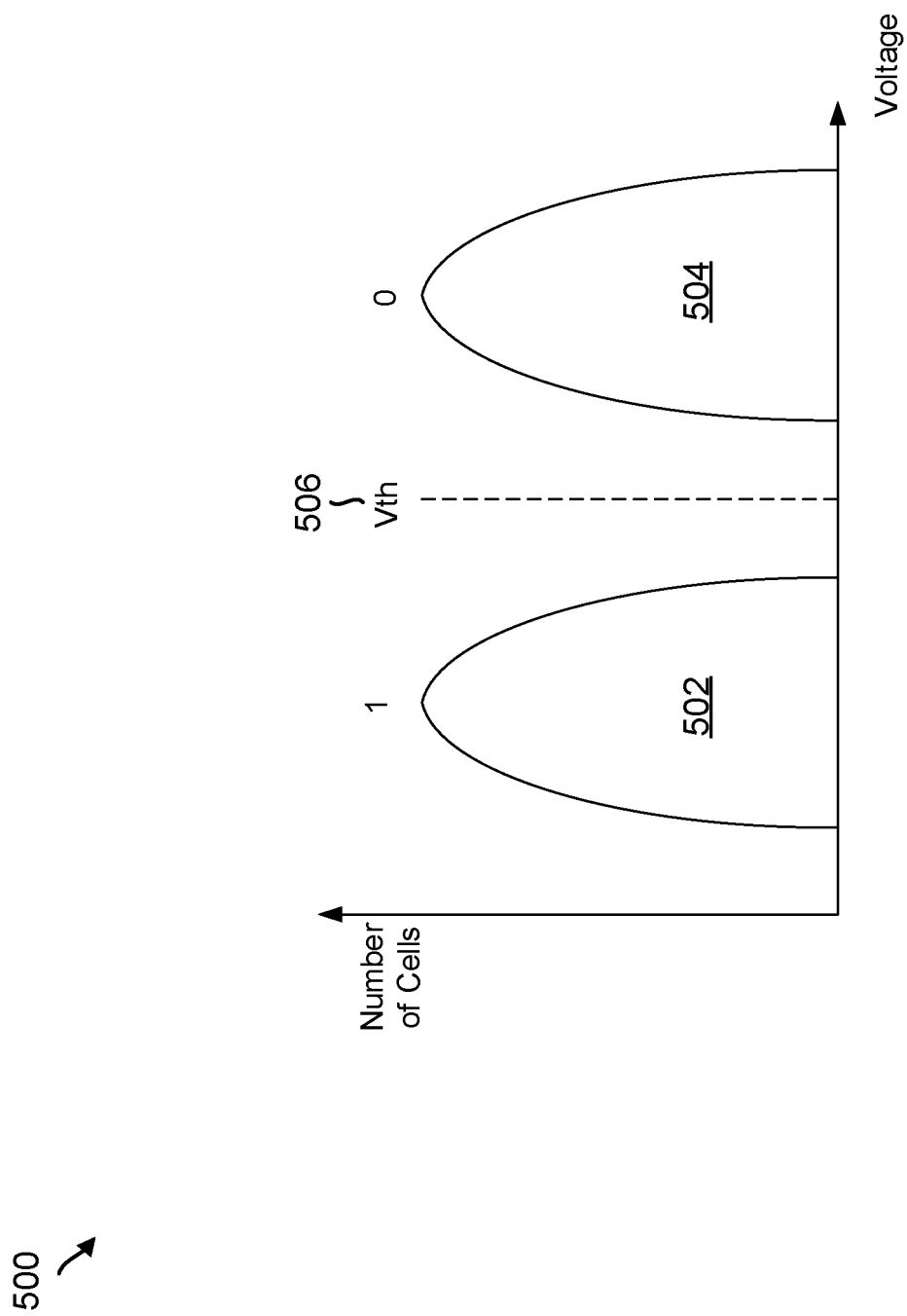
FIG. 5 is a graphical diagram illustrating an example of a voltage distribution chart for single-level cells in the storage device of FIG. 1.

FIG. 5 illustrates an example of a voltage distribution chart 500 illustrating different NAND states for SLCs (e.g. cells 116, 302) storing one bit of data (e.g. a logic 0 or 1). The SLCs may be in an erase state 502 corresponding to logic '1', or a program state 504 corresponding to logic '0'. Initially, the cells 116, 302 may be in the erase state 502, e.g. after the controller 123 erases a block 114, 402 including the cells. While FIG. 5 illustrates two NAND states for SLCs (e.g. logic 0 and logic 1), the number of states may be different depending on the amount of data that is stored in each cell 116, 302. For example, MLCs may have four states (e.g. logic 00, 01, 10, 11), TLCs may have eight states, and QLCs may have sixteen states.

When the controller 123 attempts to erase cells of a block (e.g. block 402) into the erase state 502, the controller may perform incremental step pulse erasing (ISPE) over a number of erase loops or ISPE cycles. For example, the controller may apply an erase voltage (e.g. a high voltage, Vera) to the substrate 318 (e.g. the p-well) of the cells 302 in the selected block 114, 402, a low voltage (e.g. ground) to the word lines 304, 408 coupled to the cells 302 in the selected block, and allow the SGD 310, 412 or SGS 308, 410 of the strings 404 in the selected block to remain floating. Applying a high erase voltage to the substrate/p-well allows holes to tunnel from the channel into the charge trapping layer of the cells in the block, thereby causing the threshold voltage of the cells to decrease. After the erase voltage is applied, the controller may apply an erase verify voltage (e.g. a low voltage) to the word line 304, 408 to determine whether the threshold voltage of the cells reduced below the threshold voltage 506. If the threshold voltage of the cells does not reduce below the threshold voltage 506, the controller may apply a higher erase voltage in a subsequent ISPE loop to further decrease the threshold voltage of the cells, and then again may apply an erase verify voltage to confirm whether the new threshold voltage has reduced below the threshold voltage 506. The controller may similarly repeat the above process over a number of erase loops until the controller determines the block has been successfully erased.

Figure 6:
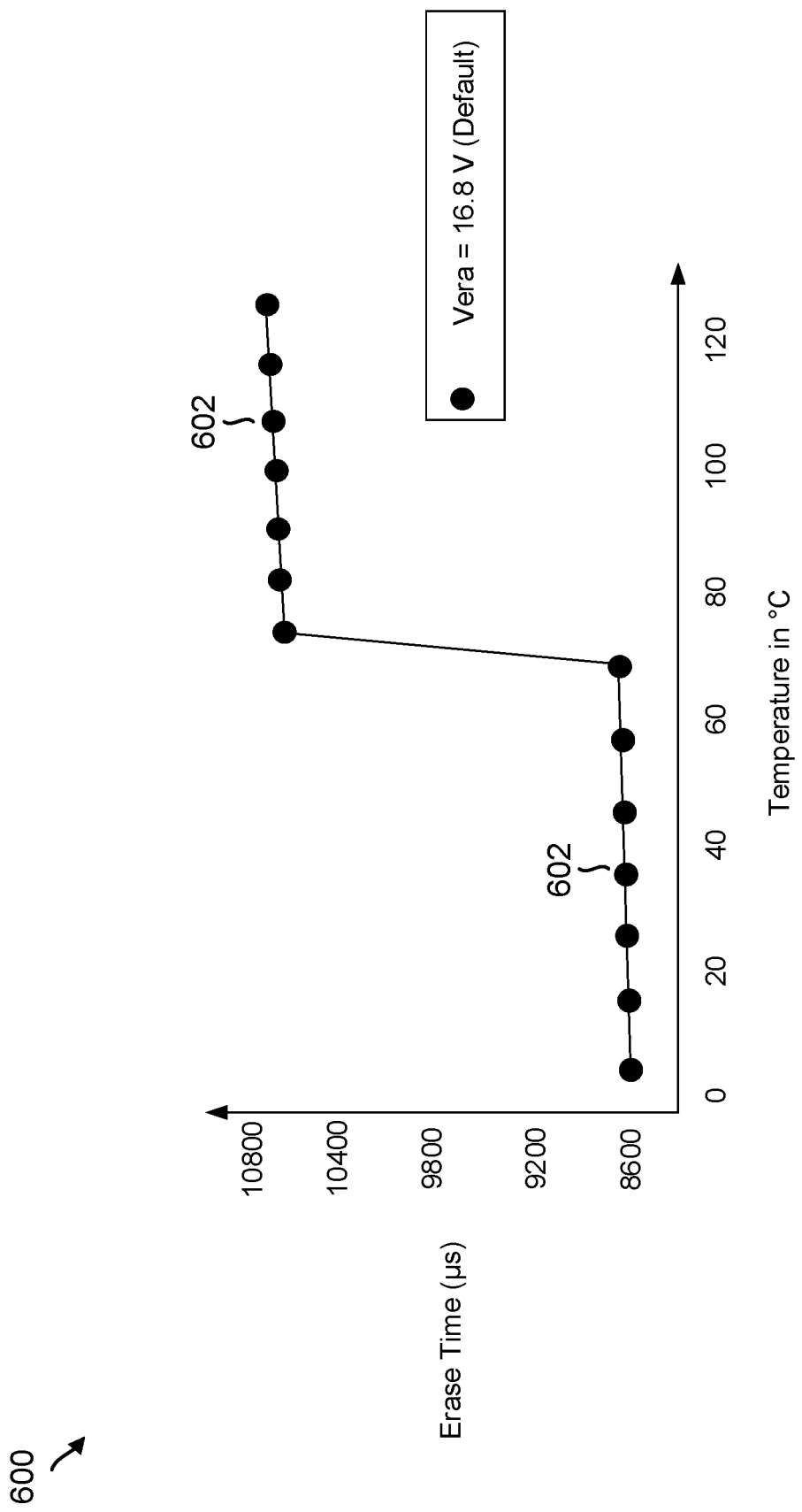
FIG. 6 is a graphical diagram illustrating an example of a relationship between erase time and temperature for a default erase voltage.

However, when the block 402 is being erased at higher temperatures, the number of erase loops (and thus erase time) required to reduce the threshold voltage of the cells 116, 302 of the block into the erase state 502 may be higher than a threshold loop count, resulting in erase failure. Such erase failure may occur even when a temperature coefficient (TCO) setting is enabled (e.g. TCO_ENABLE), in which the controller 123 may adjust voltages applied to the word lines 304, 408 or bit lines 306, 406 as a function of temperature. For instance, FIG. 6 illustrates an example 600 showing an effect of temperature on erase time for a block in a die, assuming application of a default erase voltage of 16.8 V during each erase operation 602 with TCO_ENABLE. At lower temperatures (e.g. below 65° C. in this example, although the temperature may be different in other examples), the erase time may be approximately constant for completing the erase operations 602 (e.g. for instance increasing by merely 0.35 µs per second per Celsius). However, at higher temperatures (e.g. above 65° C. in this example, although the temperature may be different in other examples), the erase time may significantly lengthen due to an increase in the number of erase loops required to reduce the threshold voltage of the cells. For instance, when the erase operation 602 is performed at temperatures above 65° C., the number of erase loops to transition the cells 302 into the erase state 502 may increase by 1 with respect to temperatures below 65° C., and thus the erase time for higher temperatures may increase by 26% relative to the erase time for lower temperatures (e.g. 2 ms) and at a higher rate than for lower temperatures (e.g. for instance by 2.4 µs per second per Celsius). As a result, the increased number of erase loops or erase time at higher temperatures may exceed a threshold loop count or time, causing the erase operations 602 to fail. Therefore, the block 402 may be identified as a GBB and replaced with an overprovisioned block, thus increasing the WAF of the storage device 102 and hence degrading endurance and performance of the device.

Figure 7:
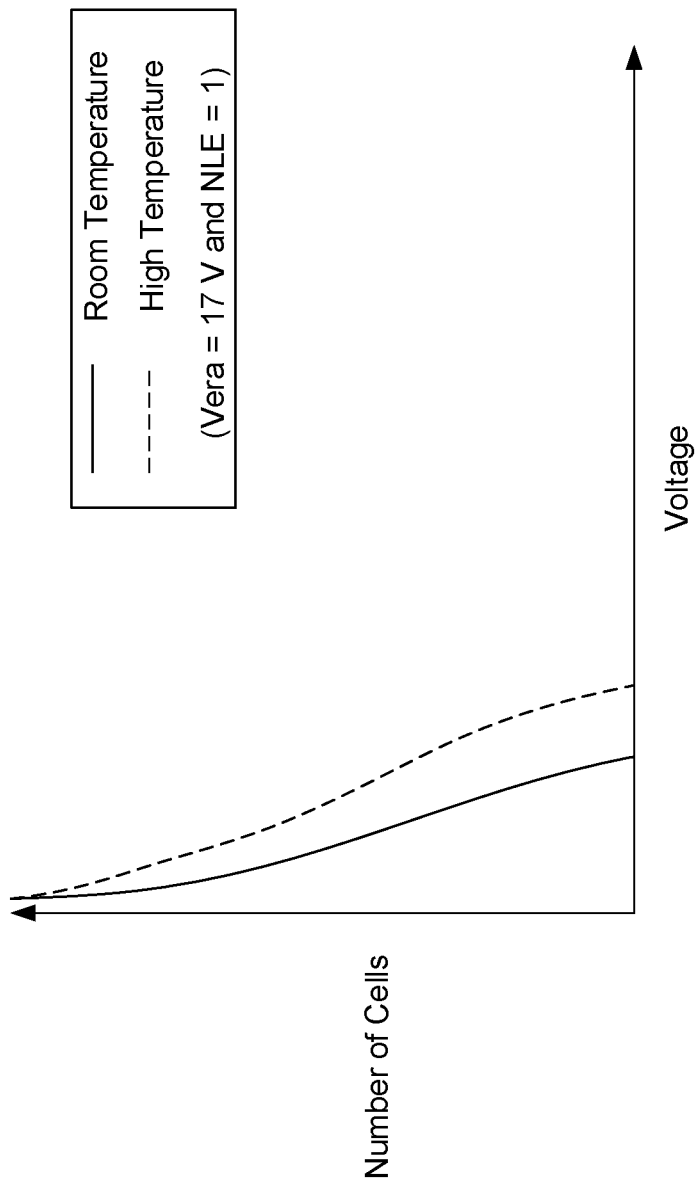
FIG. 7 is a graphical diagram illustrating an example of voltage distributions of cells showing different erase tails at lower and higher operating temperatures.

At higher temperatures, less holes may be tunneled into the charge trapping layer through the polysilicon channel to neutralize the electrons and reduce the threshold voltage of the cells to the erase state. Thus, more cells may not be successfully erased at higher temperatures than at lower temperatures in response to the same applied erase voltage in the same number of erase loops. This phenomenon may be illustrated in the example 700 of FIG. 7, which depicts the cumulative voltage distributions of cells showing different erase tails at room temperature (25° C.) and elevated temperature (85° C.) in response to an applied erase voltage (Vera) of 17 V in a single erase loop (i.e. the number of erase loops (NLE)=1). As shown in example 700, after Vera is applied in one erase loop, the threshold voltages of cells at elevated temperature may generally be higher than the threshold voltages of cells at room temperature. In other words, a smaller number of holes may be inserted into the charge trapping layer of cells at the elevated temperature than of cells at room temperature in response to the same Vera after one erase loop, resulting in longer erase times at elevated temperatures and subsequently erase failure.

Figures 9A, 9B, 9C, 9D, 9E:
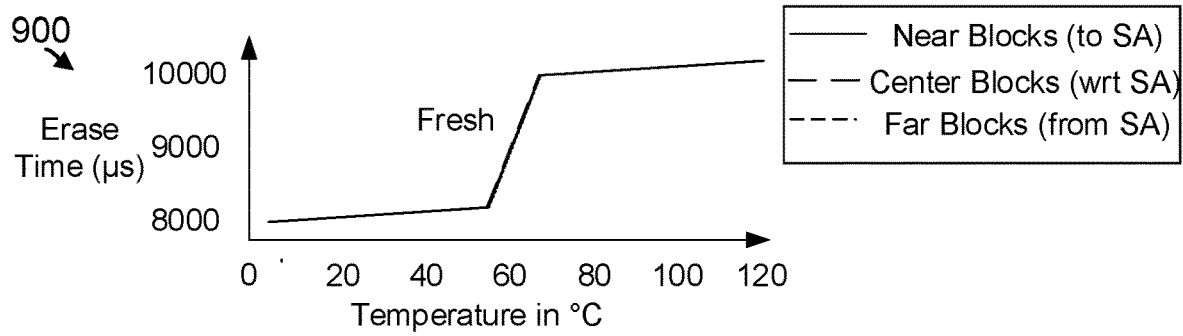
FIGS. 9A-9E are graphical diagrams illustrating examples of a relationship between erase time and temperature for blocks at different locations of a die with different numbers of program/erase cycles.

The temperature at which point the number of erase loops may increase (e.g. 65° C. in example 600) may be different for different dies. FIGS. 8A-8C illustrate examples 800, 820, 840 of different relationships between erase time and temperature for different dies. For instance, FIG. 8A illustrates the example 800 of a die where the erase time for a block may increase after the temperature reaches 110° C., FIG. 8B illustrates the example 820 of a die where the erase time for a block may increase after the temperature reaches 65° C. (e.g. example 600 of FIG. 6), and FIG. 8C illustrates the example 840 of a die where the erase time for a block may increase after the temperature reaches 95° C. In contrast, the temperature at which point the number of erase loops may increase for blocks 402 in the same die may be similar at different block locations with respect to the sense amplifiers 124 and for different numbers of P/E cycles. FIGS. 9A-9E illustrate examples 900, 920, 940, 960, 980 of relationships between erase time and temperature for blocks at different locations of a die (i.e. far from the sense amplifier, near the sense amplifier, or in between/central) with different numbers of P/E cycles. For instance, FIG. 9A illustrates the example 900 where the erase time for a fresh block (i.e. with few P/E cycles) irrespective of block location may increase after the temperature reaches 65° C., while FIGS. 9B-9E illustrate similar examples 920, 940, 960, 980 where the erase time for a block respectively with 300 P/Es, 1500 P/Es, 3000 P/Es, and 4000 P/Es and irrespective of block location may similarly increase after the temperature reaches 65° C.

Thus, erase failure may occur in blocks of different dies at different high temperatures (e.g. above 65° C., 95° C., 110° C., etc.), where each high temperature of a die is common to the blocks within that die and irrespective of block location and P/E cycles. For instance, as described above, the NLE may increase by 1 and the erase time may increase by 2 ms to complete an erase operation for blocks at a die-dependent and block-independent elevated temperature due to smaller number of holes being injected into the charge trapping layer of the cells in response to a default applied erase voltage. Such increase in NLE or erase time may exceed a threshold loop count or expected time limit and thus result in a failed erase operation.

Figure 10:
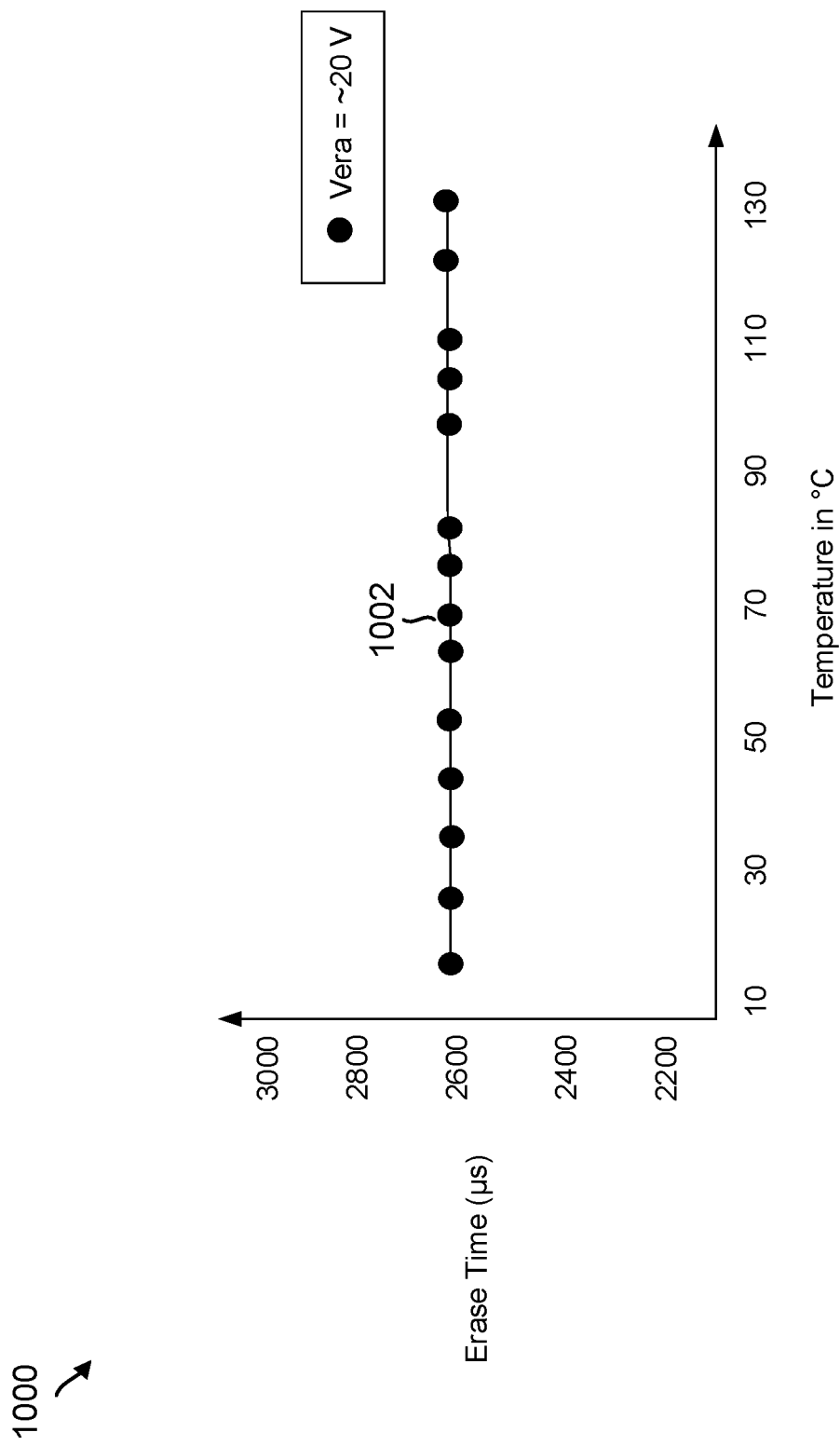
FIG. 10 is a graphical diagram illustrating an example of a relationship between erase time and temperature for an elevated erase voltage.

Accordingly, to increase the number of injected holes during an erase loop and thereby complete the erase operation within the threshold loop count or expected time, the controller 123 may increase the applied erase voltage (e.g. apply an adaptive Vera) based on temperature. For instance, FIG. 10 illustrates an example 1000 showing a common erase time for a block in a die when an elevated erase voltage (e.g. approximately 20 V) is applied during each erase operation 1002 in comparison to the default erase voltage (e.g. 16.8 V) shown in FIG. 6. The higher Vera allows more holes to be tunneled into the charge trapping layer at higher temperatures (e.g. above 60° C. in this example), thereby preventing the number of loops or erase time from significantly increasing at elevated temperatures and minimizing erase failure.

However, as constantly applying such higher Vera at lower and higher temperatures such as illustrated in FIG. 10 may stress the NAND (e.g. the NVM 110), the controller 123 may marginally (or minimally) increase the erase voltage at elevated temperatures such as shown in the example temperature-voltage mapping of Table 1 below. Minimally increasing the erase voltage at higher temperatures while maintaining a smaller or default erase voltage at lower temperatures may allow erase operations 1002 to be completed within the same number of erase loops without unduly stressing the memory of the storage device, reducing the WAF of the device and thus improving endurance and performance. For example, the controller 123 may apply an erase voltage of 17.5 V at higher temperatures, or some other voltage marginally above the default voltage applied at lower temperatures (e.g. 16.8 V), that allows the erase operation to be completed without changing the number of erase loops required at different temperatures.

TABLE 1

| Temperature | Vera | NLE |
| --- | --- | --- |
| 25° C. | 16.8 V | 4 |
| 50° C. | 16.8 V | 4 |
| 75° C. | 17.5 V | 4 |
| 100° C. | 17.5 V | 4 |

Moreover, to account for the different higher temperatures in different dies, the erase voltage may be applied to blocks in different dies according to separate temperature-voltage mappings. For example, the controller 123 may store and apply a temperature-voltage mapping for one die where the Vera increases beginning at 75° C. such as shown in Table 1 above, and the controller 123 may store and apply a different temperature-voltage mapping for another die where the Vera increases only beginning at 100° C. The temperature threshold at which point the erase voltage may increase (e.g. 75° C. or 100° C. in the above example, or 65° C., 95° C., or 110° C. in the examples of FIGS. 8A-8C and 9A-9E), or the temperature ranges during which lower and higher Vera may be applied (e.g. less than/at least 75° C. or 100° C. in the above example), may be different in other examples based on each die.

The adaptive erase voltage may be similarly applied based on each mapping to blocks of the same die independent of block location and P/E cycles. For example, the controller 123 may increase the Vera to 17.5 V beginning at 75° C. for all blocks in one die and beginning at 100° C. for all blocks in another die, irrespective of whether the blocks are near, center to, or far from a sense amplifier and whether they are newer (e.g. fresh) or older blocks (with more P/E cycles).

Figure 11:
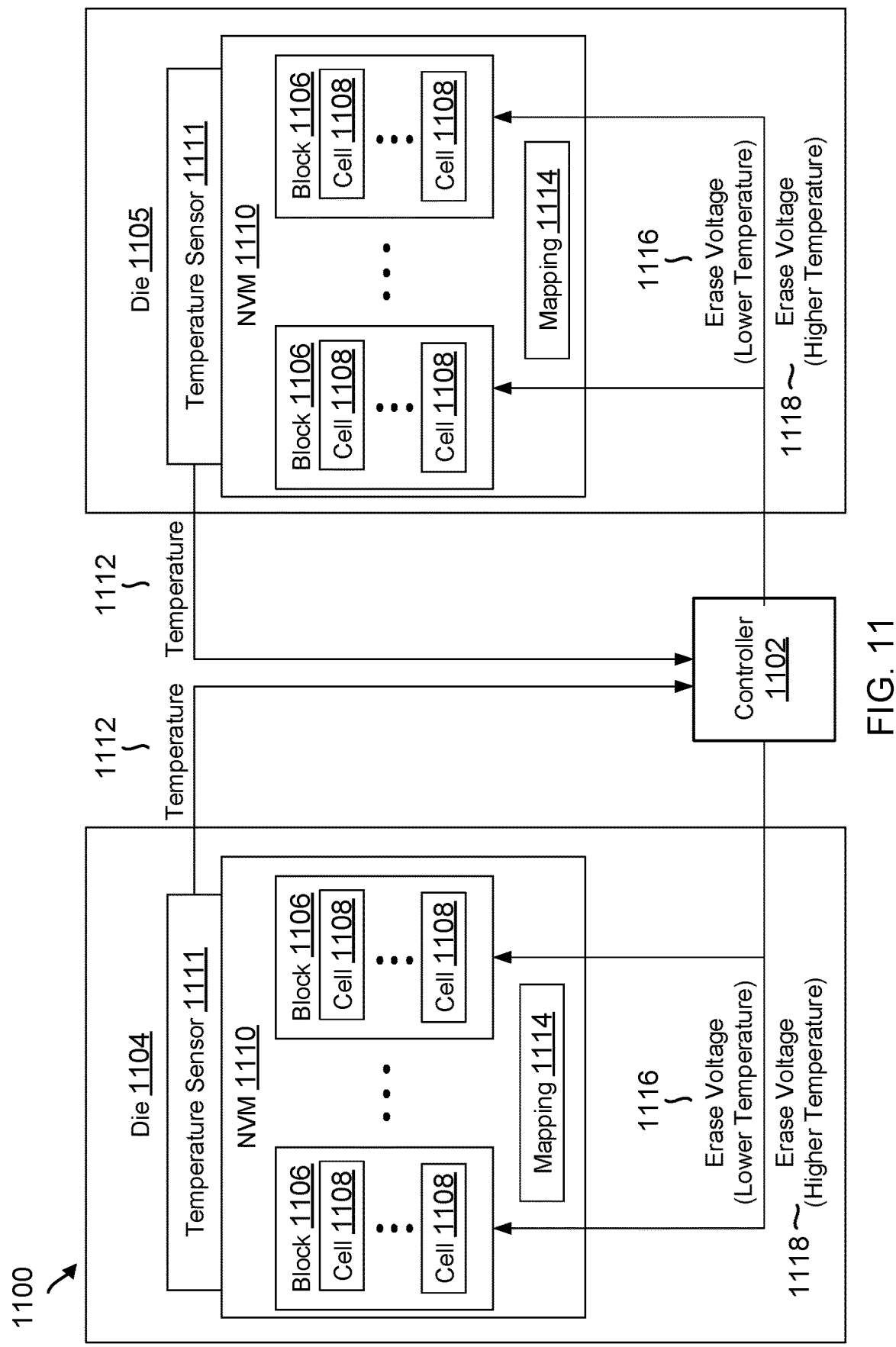
FIG. 11 is a conceptual diagram illustrating an example of a controller that applies different erase voltages to blocks in different dies based on temperatures of the dies within the storage device of FIG. 1.

FIG. 11 illustrates an example diagram 1100 of a controller 1102 in communication with multiple dies 1104, 1105. Each die 1104, 1105 may include a plurality of blocks 1106 including cells 1108. The controller 1102 may correspond to controller 123 of FIG. 1, and each die 1104, 1105 may include a NVM 1110 corresponding to the NVM 110 of FIG. 1. The NVM 1110 may include the blocks 1106 of cells 1108, which may respectively correspond to blocks 114, 402 and cells 116, 302 of FIGS. 1, 3 and 4. Moreover, while FIG. 11 illustrates the controller 1102 being external to the dies 1104, 1105, the controller may alternatively be internal to the dies.

Each die 1104, 1105 may include a temperature sensor 1111 that detects or senses a temperature 1112 of the blocks 1106 or cells 1108 of each NVM 1110. For instance, each temperature sensor 1111 may sense the temperature 1112 at which one or more of the cells, blocks 1106 or the NVM 1110 of the 1104 is operating (e.g. 25° C., 50° C., 75° C., 100° C., etc.). The controller 1102 in communication with each die 1104, 1105 may receive the temperature 1112 that is sensed by each temperature sensor 1111. The controller 1102 may also configure and store a mapping 1114 (e.g. a voltage-temperature mapping such as illustrated in Table 1 and described above) for each die 1104. The mappings 1114 may be stored in and accessed from the NVM 1110 of each die 1104, 1105 as illustrated in the example of FIG. 11, in a volatile memory of each die, or in a volatile memory of the controller 1102.

When the controller 1102 performs an erase operation for one of the blocks 1106, the controller may erase the block (e.g. using ISPE over a number of erase loops) by applying an erase voltage 1116, 1118 to the substrate (e.g. the substrate 318 or p-well) of each of the cells 1108 of the block 1106 based on the temperature 1112 and mapping 1114 for the die 1104, 1105. The erase voltage 1116 for lower temperatures may be smaller than the erase voltage 1118 for higher temperatures. For example, the controller may apply the smaller erase voltage 1116 (e.g. 16.8 V) to the cells of the block 1106 when the controller determines that the temperature 1112 sensed from the die is a particular temperature (e.g. 50° C.), is within a particular temperature range (e.g. between 25° C. and 75° C.), or is less than a particular temperature threshold (e.g. less than 75° C.), that is determined from the mapping 1114. Similarly, the controller may apply the larger erase voltage 1118 (e.g. 17.5 V) to the cells of the block 1106 when the controller determines that the temperature 1112 sensed from the die is another temperature (e.g. 100° C.), is within another temperature range (e.g. between 75° C. and 125° C.), or is greater than another temperature threshold (e.g. greater than 75° C.), that is determined from the mapping 1114. The controller 1102 may apply different smaller erase voltages 1116 and larger erase voltages 1118 commonly to all of the blocks 1106 of each die based on the respective temperature 1112 and mapping 1114 of each die 1104, 1105 (e.g. at different temperatures, within different temperatures ranges, or according to different temperature thresholds). As a result, the controller 1102 may adaptively change the erase voltage 1116, 1118 based on the temperature 1112 of each die 1104, 1105, thereby minimizing erase failures.

Figure 12:
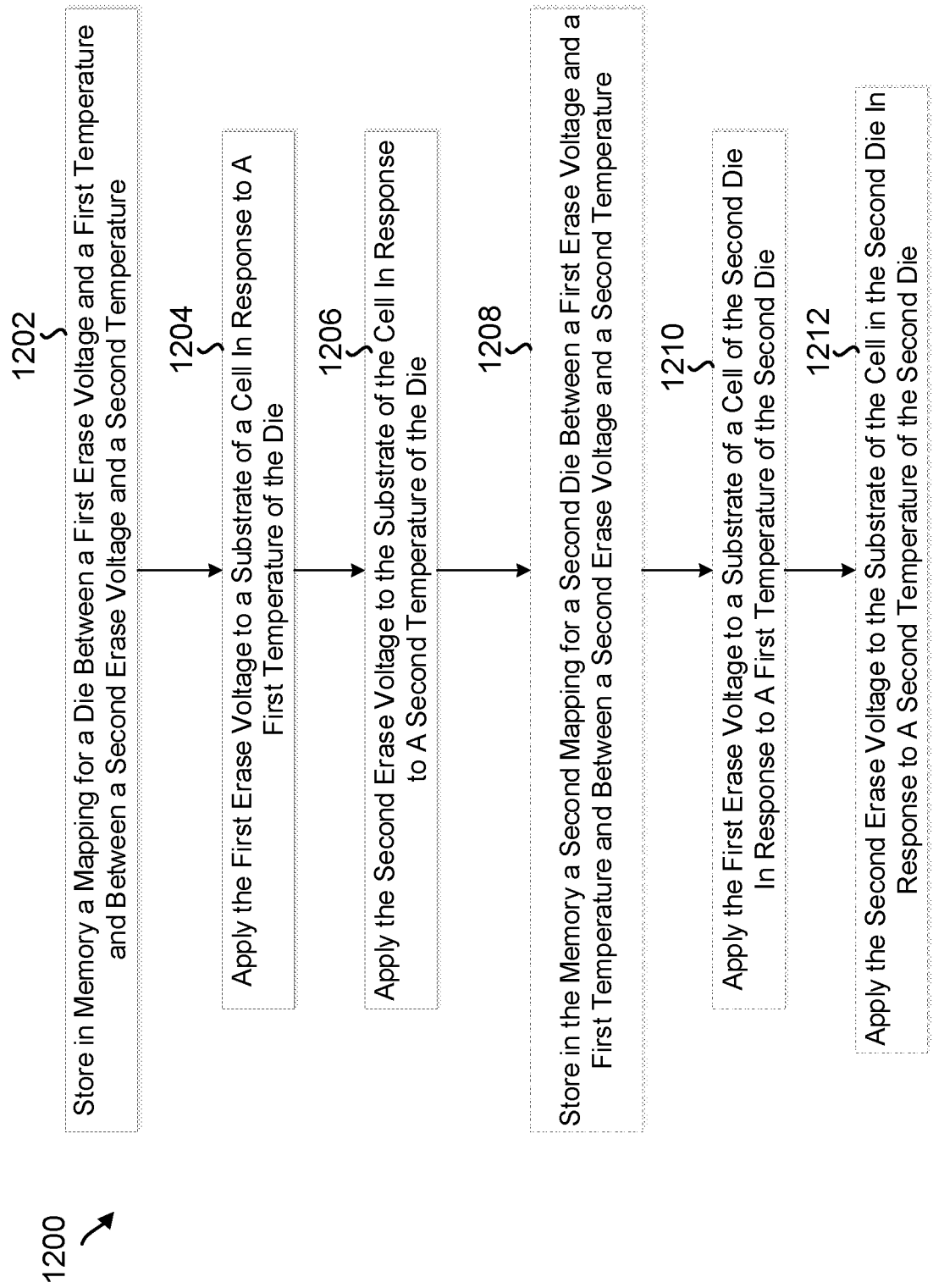
FIG. 12 is a flow chart illustrating a method for applying different erase voltages to blocks based on temperature, which is performed by the storage device of FIG. 1.

FIG. 12 illustrates an example flow chart 1200 of a method for a method for applying different erase voltages to blocks based on temperature. For example, the method can be carried out in a storage device 102 such as the one illustrated in FIG. 1. Each of the steps in the flow chart can be controlled using the controller as described below (e.g. controller 123, 1102), or by some other suitable means.

As represented by block 1202, the controller may store in memory a mapping for a die between a first erase voltage and a first temperature and between a second erase voltage and a second temperature. In one example, the controller may store in the memory a mapping for the die between the first erase voltage and a first temperature range and between the second erase voltage and a second temperature range. For instance, referring to FIG. 11, the controller 1102 may store in the NVM 1110 of a die 1104 (or in a volatile memory of the die or a volatile memory of the controller) a mapping 1114 for the die 1104 between a first erase voltage (e.g. erase voltage 1116) and a first temperature (e.g. 50° C. in Table 1 above) and between a second erase voltage (e.g. erase voltage 1118) and a second temperature (e.g. 75° C. in Table 1 above). In one example, the controller may store in the memory the mapping 1114 for the die 1104 between the erase voltage 1116 and a first temperature range (e.g. 25-50° C. in Table 1 above) and between the erase voltage 1118 and a second temperature range (e.g. 75-100° C. in Table 1 above).

As represented by block 1204, the controller may apply a first erase voltage to a substrate of a cell in memory in response to a first temperature of the memory, and as represented by block 1206, the controller may apply a second erase voltage larger than the first erase voltage to the substrate of the cell in response to a second temperature of the memory. The second temperature may be higher than the first temperature. For instance, the memory may comprise a die including a plurality of blocks each including a plurality of cells, and the controller may apply the first erase voltage to the cells of each of the blocks in response to the first temperature and apply the second erase voltage to the cells of each of the blocks in response to the second temperature. For example, referring to FIGS. 3 and 11, the controller 1102 may apply the erase voltage 1116 to a substrate 318 of a cell 302, 1108 in the NVM 1110 in response to detecting using the temperature sensor 1111 the temperature 1112 (e.g. 50° C.) of the NVM 1110 or blocks 1106, and the controller may apply the erase voltage 1118 to the substrate 318 of the cells 302, 1108 in response to detecting using the temperature sensor 1111 the temperature 1112 (e.g. 75° C.) of the NVM 1110 or blocks 1106. For instance, the controller may apply the erase voltage 1116 to the cells 1108 of each of the blocks 1106 in the die 1104 in response to the lower temperature and the controller may apply the erase voltage 1118 to the cells of each of the blocks in the die in response to the higher temperature.

In one example, the controller may apply a first erase voltage to each of the cells in response to the die being within a first temperature range, and to apply a second erase voltage larger than the first erase voltage to each of the cells when the die is within a second temperature range including higher temperatures than the first temperature range. For instance, referring to FIG. 11, the controller 1102 may apply the erase voltage 1116 to each of the cells 1108 in response to detecting using the temperature sensor 1111 that the die 1104 is within a first temperature range (e.g. 25-50° C.), and the controller 1102 may apply the erase voltage 1118 to each of the cells 1108 in response to detecting using the temperature sensor 1111 that the die 1104 is within a second temperature range including higher temperatures than the first temperature range (e.g. 75-100° C.).

The controller may apply the first erase voltage to erase the cells within a number of erase loops, and the controller may apply the second erase voltage to erase the cells within a same number of erase loops. The second erase voltage may comprise a minimum erase voltage above the first erase voltage to erase the cells within the same number of erase loops. For example, referring to FIG. 11 and Table 1 above, the controller 1102 may apply the erase voltage 1116 to erase the cells 1108 within 4 NLEs (or another number), and the controller 1102 may apply the erase voltage 1118 to erase the cells 1108 also within 4 NLEs (or another identical number). The erase voltage 1118 (e.g. 17.5 V) may be a minimum or marginally higher erase voltage above the erase voltage 1116 (e.g. 16.8 V) that may be applied to erase the cells 1108 within the same number of NLEs.

As represented by block 1208, the memory may comprise a second die including a plurality of cells, and the controller may store in the memory a second mapping between the first erase voltage and a first temperature of the second die and between the second erase voltage and a second temperature of the second die. For instance, referring to FIG. 11, the controller 1102 may store in the NVM 1110 of a die 1105 (or in a volatile memory of the die or a volatile memory of the controller) a mapping 1114 for the die 1105 between the first erase voltage (e.g. erase voltage 1116) and a first temperature (e.g. 75° C.) and between the second erase voltage (e.g. erase voltage 1118) and a second temperature (e.g. 100° C.). The mapping 1114 for the die 1105 may be different than the mapping for the die 1104.

In one example, the controller may store in the memory a second mapping between the first erase voltage and the first temperature range of the second die and between the second erase voltage and the second temperature range of the second die. In another example, the controller may store in the memory a first temperature threshold and a second temperature threshold. For example, referring to FIG. 11, the controller 1102 may store in the NVM 1110 or volatile memory the mapping 1114 for the die 1105 between the erase voltage 1116 and a first temperature range (e.g. 25-75° C.) and between the erase voltage 1118 and a second temperature range (e.g. 100-125° C.). In another example, the controller 1102 may store in the memory a first temperature threshold (e.g. the first temperature 75° C.) and a second temperature threshold (e.g. the second temperature 100° C.), based on which the controller may apply either the erase voltage 1116 or erase voltage 1118.

As represented by block 1210, the controller may apply the first erase voltage to the cells of the second die in response to a first temperature of the second die, and as represented by block 1212, the controller may apply the second erase voltage to the cells of the second die in response to a second temperature of the second die. The second temperature of the second die may be different than the second temperature of the first die. For example, referring to FIGS. 3 and 11, the controller 1102 may apply the erase voltage 1116 to a substrate 318 of a cell 302, 1108 in the NVM 1110 in response to detecting using the temperature sensor 1111 the temperature 1112 (e.g. 75° C.) of the NVM 1110 or blocks 1106, and the controller may apply the erase voltage 1118 to the substrate 318 of the cells 302, 1108 in response to detecting using the temperature sensor 1111 the temperature 1112 (e.g. 100° C.) of the NVM 1110 or blocks 1106. For instance, the controller may apply the erase voltage 1116 to the cells 1108 of each of the blocks 1106 in the die 1105 in response to the lower temperature and the controller may apply the erase voltage 1118 to the cells of each of the blocks in the die in response to the higher temperature. The second temperature described above for die 1105 (e.g. 100° C.) may be different than the second temperature described above for die 1104 (e.g. 75° C.).

In one example, the controller may apply the first erase voltage to the cells of the second die in response to the second die being within a first temperature range, and the controller may apply the second erase voltage to the cells of the second die in response to the second die being within a second temperature range. The second temperature range of the second die may be different than the second temperature range of the first die. For instance, referring to FIG. 11, the controller 1102 may apply the erase voltage 1116 to each of the cells 1108 in response to detecting using the temperature sensor 1111 that the die 1105 is within a first temperature range (e.g. 25-75° C.), and the controller 1102 may apply the erase voltage 1118 to each of the cells 1108 in response to detecting using the temperature sensor 1111 that the die 1105 is within a second temperature range including higher temperatures than the first temperature range (e.g. 100-125° C.). The second temperature range described above for die 1105 (e.g. 100-125° C.) may be different than the second temperature range described above for die 1104 (e.g. 75-100° C.).

In another example, the controller may apply a first erase voltage to the first cell when a temperature of the first die does not meet a first temperature threshold and to apply a second erase voltage to the first cell when the temperature of the first die meets the first temperature threshold. The controller may further apply the first erase voltage to the second cell when a temperature of the second die does not meet a second temperature threshold and apply the second erase voltage to the second cell when the temperature of the second die meets the second temperature threshold. The second temperature threshold may be different than the first temperature threshold. For example, referring to FIGS. 3 and 11, the controller 1102 may apply the erase voltage 1116 to a substrate 318 of a cell 302, 1108 in die 1104 in response to detecting using the temperature sensor 1111 that a temperature 1112 of the NVM 1110 or blocks 1106 does not meet a temperature threshold (e.g. 75° C. in the mapping 1114), and the controller may apply the erase voltage 1118 to the substrate 318 of the cells 302, 1108 in die 1104 in response to detecting using the temperature sensor 1111 that a temperature 1112 of the NVM 1110 or blocks 1106 meets the temperature threshold. Similarly, the controller 1102 may apply the erase voltage 1116 to a substrate 318 of a cell 302, 1108 in die 1105 in response to detecting using the temperature sensor 1111 that a temperature 1112 of the NVM 1110 or blocks 1106 does not meet a different temperature threshold (e.g. 100° C. in the mapping 1114), and the controller may apply the erase voltage 1118 to the substrate 318 of the cells 302, 1108 in die 1105 in response to detecting using the temperature sensor 1111 that a temperature 1112 of the NVM 1110 or blocks 1106 meets the different temperature threshold.

Accordingly, the storage device described in the present disclosure allows for erase operations to be adaptively processed at different temperatures by changing the erase voltage (Vera) which is applied to the substrates of the cells in a block. Increasing the erase voltage at higher temperatures may prevent significant increases in erase time, and thus minimize the likelihood of subsequent erase failures. As a result, less blocks may be identified as GBBs, thus reducing WAF and enhancing the endurance and performance of the storage device. The performance of RPG products, which typically include operating temperatures that may exceed 100° C., may thus be improved.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory comprising a cell; and
   a controller configured to apply a first erase voltage to a substrate of the cell to erase the cell within a number of erase loops in response to a first temperature of the memory, to minimally increase the first erase voltage to a second erase voltage larger than the first erase voltage in response to a second temperature of the memory, and to apply the second erase voltage to the substrate of the cell to erase the cell within a same number of erase loops, wherein the second temperature is higher than the first temperature and the second erase voltage is a minimum erase voltage above the first erase voltage for erasing the cell within the same number of erase loops.

2. The storage device of claim 1, wherein the memory comprises a block including a plurality of cells, and wherein the controller is configured to apply the first erase voltage to the cells of the block in response to the first temperature and to apply the second erase voltage to the cells of the block in response to the second temperature.

3. The storage device of claim 1, wherein the memory comprises a first die including a plurality of blocks, the blocks each including a plurality of cells, and wherein the controller is configured to apply the first erase voltage to the cells of each of the blocks in response to the first temperature and to apply the second erase voltage to the cells of each of the blocks in response to the second temperature.

4. The storage device of claim 3, wherein the controller is configured to store in the memory a mapping for the first die between the first erase voltage and the first temperature and between the second erase voltage and the second temperature.

5. The storage device of claim 3, further comprising a second die including a plurality of cells, wherein the controller is configured to apply the first erase voltage to the cells of the second die in response to a first temperature of the second die, and wherein the controller is configured to apply the second erase voltage to the cells of the second die in response to a second temperature of the second die.

6. The storage device of claim 5, wherein the second temperature of the second die is different than the second temperature of the first die.

7. The storage device of claim 5, wherein the controller is configured to store in the memory a second mapping between the first erase voltage and the first temperature of the second die and between the second erase voltage and the second temperature of the second die.

8. A storage device, comprising:
a memory comprising a first die including a plurality of cells; and
a controller configured to apply a first erase voltage to each of the cells to erase the cells within a number of erase loops in response to the first die being within a first temperature range, to minimally increase the first erase voltage to a second erase voltage larger than the first erase voltage in response to the first die being within a second temperature range, and to apply the second erase voltage to each of the cells to erase the cells within a same number of erase loops, wherein the second temperature range includes higher temperatures than the first temperature range and the second erase voltage is a minimum erase voltage above the first erase voltage for erasing the cell within the same number of erase loops.

9. The storage device of claim 8, wherein the controller is configured to store in the memory a mapping for the first die between the first erase voltage and the first temperature range and between the second erase voltage and the second temperature range.

10. The storage device of claim 8, further comprising a second die including a plurality of cells, wherein the controller is configured to apply the first erase voltage to the cells of the second die in response to the second die being within a first temperature range of the second die, and wherein the controller is configured to apply the second erase voltage to the cells of the second die in response to the second die being within a second temperature range of the second die.

11. The storage device of claim 10, wherein the second temperature range of the second die is different than the second temperature range of the first die.

12. The storage device of claim 10, wherein the controller is configured to store in the memory a second mapping between the first erase voltage and the first temperature range of the second die and between the second erase voltage and the second temperature range of the second die.

13. A storage device, comprising:
a memory comprising a first die and a second die, the first die including a first cell and the second die including a second cell;
a controller configured to apply a first erase voltage to the first cell to erase the first cell within a first number of erase loops when a temperature of the first die does not meet a first temperature threshold, to minimally increase the first erase voltage to a second erase voltage when the temperature of the first die meets the first temperature threshold, and to apply the second erase voltage to the first cell to erase the first cell within the first number of erase loops, wherein the second erase voltage is a minimum erase voltage above the first erase voltage for erasing the first cell within the first number of erase loops, and
wherein the controller is further configured to apply a third erase voltage to the second cell to erase the second cell within a second number of erase loops when a temperature of the second die does not meet a second temperature threshold, to minimally increase the third erase voltage to a fourth erase voltage when the temperature of the second die meets the second temperature threshold, and to apply the fourth erase voltage to the second cell to erase the second cell within the second number of erase loops, wherein the fourth erase voltage is another minimum erase voltage above the third erase voltage for erasing the second cell within the second number of erase loops, and the second temperature threshold is different than the first temperature threshold.

14. The storage device of claim 13, wherein the controller is configured to store in the memory the first temperature threshold and the second temperature threshold.

* * * * *